(12) United States Patent
Teranishi et al.

(10) Patent No.: US 12,218,027 B2
(45) Date of Patent: Feb. 4, 2025

(54) ELECTRICAL DEVICE AND ELECTRONIC CONTROL DEVICE WITH HOUSINGS HAVING FIN ARRANGEMENT AND FAN FOR AIR FLOW

(71) Applicant: HITACHI ASTEMO, LTD., Hitachinaka (JP)

(72) Inventors: Minami Teranishi, Tokyo (JP); Hideyuki Sakamoto, Hitachinaka (JP); Shinya Kawakita, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 422 days.

(21) Appl. No.: 17/636,124

(22) PCT Filed: Apr. 20, 2020

(86) PCT No.: PCT/JP2020/017114
§ 371 (c)(1),
(2) Date: Feb. 17, 2022

(87) PCT Pub. No.: WO2021/038954
PCT Pub. Date: Mar. 4, 2021

(65) Prior Publication Data
US 2022/0293487 A1    Sep. 15, 2022

(30) Foreign Application Priority Data

Aug. 30, 2019   (JP) .................................. 2019-158389

(51) Int. Cl.
*H05K 7/20*       (2006.01)
*H01L 23/367*    (2006.01)
*H01L 23/467*    (2006.01)

(52) U.S. Cl.
CPC ........ *H01L 23/3677* (2013.01); *H01L 23/467* (2013.01); *H05K 7/20136* (2013.01); *H05K 7/20409* (2013.01)

(58) Field of Classification Search
CPC ............ H05K 7/20136; H05K 7/20409; H01L 23/3677; H01L 23/467
(Continued)

(56) References Cited

U.S. PATENT DOCUMENTS 5,937,517 A       8/1999   Smith et al.

FOREIGN PATENT DOCUMENTS

| CN | 205191975 U | * | 4/2016 |
| JP | H05-318274 A | | 12/1993 |

(Continued)

OTHER PUBLICATIONS

Office Action issued in corresponding Japanese Application No. 2019-158389 dated Sep. 27, 2022 with Machine Translation (20 pages).

(Continued)

*Primary Examiner* — Phuc T Dang
(74) *Attorney, Agent, or Firm* — Foley & Lardner LLP

(57) ABSTRACT

An electrical device includes a first housing which has therein a first circuit board on which a first electronic component is mounted, a second housing which has therein a second circuit board on which a second electronic component is mounted, and fans which send air passing between the first housing and the second housing. The first housing has a plurality of fins facing the second housing. The second housing has a plurality of fins facing the first housing. In at least one of cross sections of the first circuit board in a thickness direction, the electrical device has a structure having a region in which the fin of the first housing is longer than the fin of the second housing and a region in which the fin of the first housing is shorter than the fin of the second housing.

13 Claims, 7 Drawing Sheets

(58) Field of Classification Search
USPC .......................................................... 257/712
See application file for complete search history.

(56) References Cited

FOREIGN PATENT DOCUMENTS

| | | | |
|---|---|---|---|
| JP | H11-314131 A | | 11/1999 |
| JP | 2002-124608 A | | 4/2002 |
| JP | 2012-028720 A | | 2/2012 |
| JP | 2012-186203 A | | 9/2012 |
| JP | 2021022596 A | * | 2/2021 |
| WO | WO-2018/079141 A1 | | 5/2018 |
| WO | WO-2020262739 A1 | * | 12/2020 ............. B60R 16/02 |

OTHER PUBLICATIONS

International Search Report with English translation and Written Opinion issued in corresponding application No. PCT/JP2020/017114 dated Jul. 14, 2020.

* cited by examiner

ELECTRICAL DEVICE AND ELECTRONIC CONTROL DEVICE WITH HOUSINGS HAVING FIN ARRANGEMENT AND FAN FOR AIR FLOW

TECHNICAL FIELD

The present invention relates to an electrical device and an electronic control device.

BACKGROUND ART

For example, an electronic control device for engine control, motor control, or the like is mounted on a vehicle such as an automobile. Such an on-vehicle electronic control device usually includes a heat generating component such as an electronic component or an electronic circuit on a circuit board.

As a background art of the present technical field, there is a technique related to a heat sink having a high fin density. For example, there is a technique described in PTL 1.

CITATION LIST

Patent Literature

PTL 1: JP H11-314131 A

SUMMARY OF INVENTION

Technical Problem

In recent years, a heat generation amount of a heat generating component used in an on-vehicle electronic control device has increased due to improvement in performance. For example, a microcomputer used in the on-vehicle electronic control device has improved performance corresponding to high-speed calculation and high-speed processing, and a heat generation amount is increased. For example, since it is necessary to mount a plurality of microcomputers in order to realize an advanced autonomous driving function, it has been studied to increase the number of circuit boards like a case where two circuit boards are used in the on-vehicle electronic control device. In a case where the number of circuit boards is increased, when fins are provided for the microcomputers mounted on each of the boards in order to dissipate heat, there is a concern about an increase in housing height. In order to further improve heat dissipation performance, it is common to increase a surface area of the fin. However, a frictional pressure loss between the fins may occur, fan performance may deteriorate, and ventilation to the fin may deteriorate.

On the other hand, reduction in size and reduction in housing volume are required for the on-vehicle electronic control device from the viewpoint of improving a degree of freedom of an on-vehicle layout. Thus, both high heat dissipation of the on-vehicle electronic control device and reduction in the housing size, particularly, height reduction need to be achieved so as not to exceed a guaranteed temperature of the heat generating component. In order to realize the height reduction and the high heat dissipation of the on-vehicle electronic control device, it is necessary to appropriately design a shape, a positional relationship, and the like of the heat sink in the circuit board. Thus, an electrical device and an electronic control device that achieve both high heat dissipation and height reduction are provided.

Solution to Problem

In order to solve the above problems, an electrical device according to one aspect of the present invention includes a first housing which has therein a first circuit board on which a first electronic component is mounted, a second housing which has therein a second circuit board on which a second electronic component is mounted, and a fan which send air passing between the first housing and the second housing. The first housing has a plurality of fins facing the second housing. The second housing has a plurality of fins facing the first housing. In at least one of cross sections of the first circuit board in a thickness direction, the electrical device has a structure having a region in which the fin of the first housing is longer than the fin of the second housing and a region in which the fin of the first housing is shorter than the fin of the second housing.

An electronic control device according to another aspect of the present invention includes a first housing which has therein a first circuit board on which a first electronic component is mounted, a second housing which has therein a second circuit board on which a second electronic component is mounted, and a third housing which has therein the first housing and the second housing. The first housing has a plurality of fins facing the second housing. The second housing has a plurality of fins facing the first housing. At least a part of heat generated in the first electronic component is transmitted to a part of the fins of the first housing. At least a part of heat generated in the second electronic component is transmitted to a part of the fins of the second housing. In at least one of cross sections of the first circuit board in a thickness direction, the electronic control device has a structure having a region in which the fin of the first housing is longer than the fins of the second housing and a region in which the fin of the first housing is shorter than the fin of the second housing.

Advantageous Effects of Invention

According to the present invention, it is possible to provide an electrical device and an electronic control device that achieve both high heat dissipation and height reduction. Other objects, configurations, and effects will be made apparent in the following descriptions.

DESCRIPTION OF EMBODIMENTS

Figure 1:
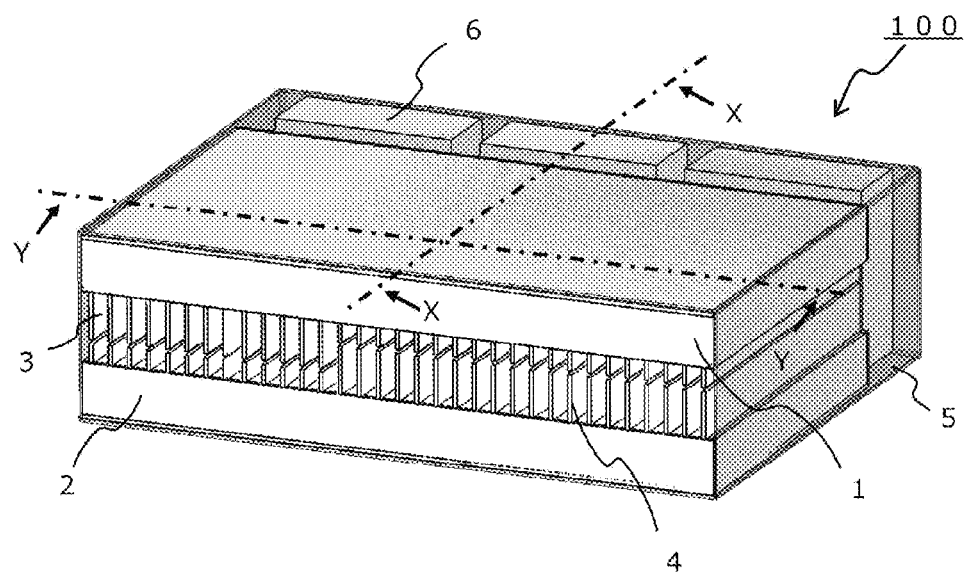
FIG. 1 is an external perspective view of an electronic control device.

Hereinafter, an embodiment of the present invention will be described with reference to the drawings. The following description and drawings are examples for describing the present invention, and are appropriately omitted and simplified in order to clarify the description. The present invention can be executed in other various forms. Unless otherwise limited, each component may be singular or plural.

Positions, sizes, shapes, and ranges of components illustrated in the drawings may not necessarily represent actual positions, sizes, shapes, and ranges in order to facilitate understanding of the invention. Thus, the present invention is not necessarily limited to the positions, sizes, shapes, and ranges disclosed in the drawings. When there is a plurality of components having the same or similar functions, the plurality of components will be described with different subscripts given to the same reference signs. In this case, when there is no need to distinguish between the plurality of components, the plurality of components will be described with the subscripts omitted.

Figure 2:
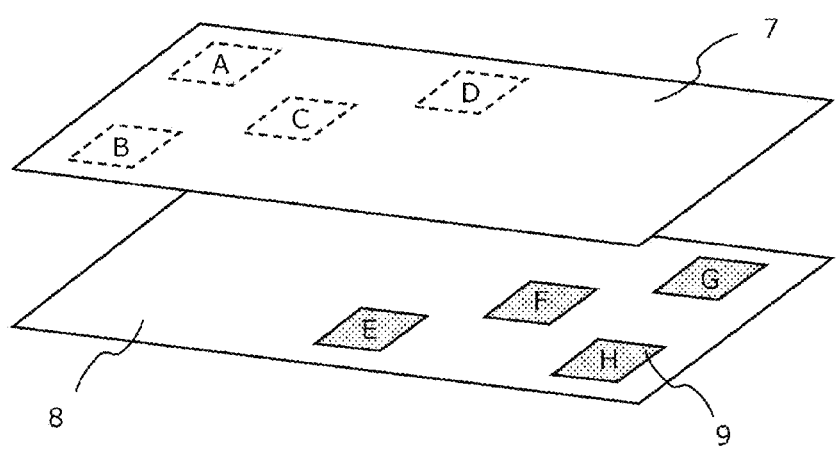
FIG. 2 is a diagram illustrating an example of component arrangement of a circuit board.
Figure 3:
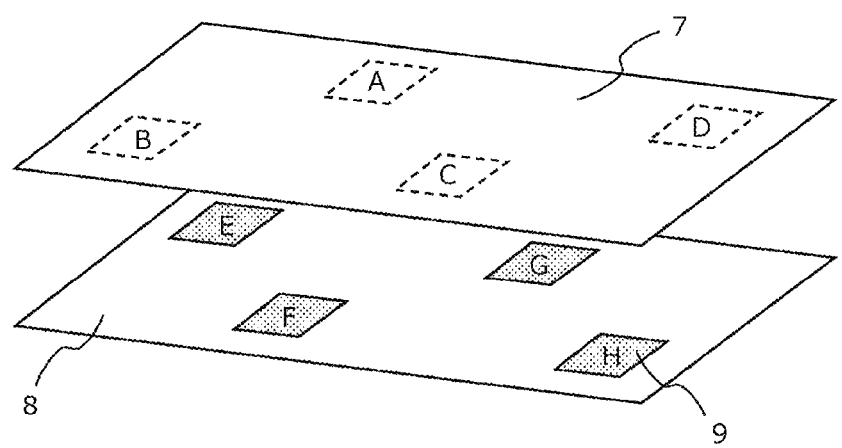
FIG. 3 is a diagram illustrating another example of the component arrangement of the circuit board.

FIG. 1 is an external perspective view of an electronic control device 100. FIG. 2 is a perspective view of a pair of circuit boards disposed in a housing of the electronic control device 100 illustrated in FIG. 1. FIG. 3 is a modification example in which the component arrangement of the pair of circuit boards illustrated in FIG. 2 is changed. As illustrated in FIG. 1, the electronic control device 100 includes heat dissipation fins 3 and 4 in order to air-cool a heat generating component built in a rectangular parallelepiped main body (housing). The electronic control device 100 has a multilayer structure, and a ventilation path is formed in a gap between layers. Heat generated in the heat generating component is conducted to a base portion of the electronic control device 100 where the heat dissipation fins 3 and 4 are implanted. Heat generating components 9 and 13 are electronic components or electronic circuits, and are, for example, integrated circuits such as microcomputers or semiconductor elements. The heat generating component may be referred to as an electronic component.

In the following description, the terms "upper", "lower", "front (front surface)", and "rear (rear surface)" maybe used for the configuration illustrated in each drawing, but these terms merely indicate a positional relationship in each drawing, and the embodiment is not limited to this positional relationship. For example, in FIG. 1, although a housing 1 may be referred to as an upper housing 1, and a housing 2 may be referred to as a lower housing 2, this device may rotate by 180 degrees to reverse a vertical positional relationship, or may rotate by 90 degrees to achieve a horizontal positional relationship.

The electronic control device 100 has the upper housing 1 and the lower housing 2. The upper housing 1 and the lower housing 2 are arranged to face each other, and the heat dissipation fins 3 and 4 are provided in a ventilation path formed between the upper housing and the lower housing. An upper heat dissipation fin 3 extends from the upper housing 1, and a lower heat dissipation fin 4 extends from the lower housing 2 so as to protrude toward each other. The upper housing 1 and the lower housing 2 are fixed by a fastening member such as a screw (not illustrated).

One or a plurality of connectors (not illustrated) or a plurality of Ethernet (registered trademark) terminals maybe arranged on sidewalls on the front surface side (front side) of the housings 1 and 2. A hole or a notch (not illustrated) for inserting a connector or the like (not illustrated) is formed, and the connector or the like is connected to a wiring pattern (not illustrated) formed on the circuit board through the hole or the notch. Transmission and reception of a power and a control signal are performed between the external device and the electronic control device 100 via the connector or the like.

Air cooling fans 6 are arranged in the rear of the housings 1 and 2. The cover (housing) 5 has an opening serving as an intake hole or an exhaust hole on a front or rear surface and a wall on a surface other than the front and rear surfaces such that air sent by the air cooling fans 6 flows between the heat dissipation fins 3 and 4.

Circuit boards 7 and 8 are provided inside the housings 1 and 2, respectively. The upper housing 1 houses an upper circuit board 7. The lower housing 2 houses a lower circuit board 8. The heat dissipation fins 3 and 4 are provided between the circuit board 7 and the circuit board 8.

One or more heat generating components 9 including a semiconductor element such as a microcomputer are mounted on each of the circuit boards 7 and 8. In the examples illustrated in FIGS. 2 and 3, positions of four heat generating components 9 mounted on the circuit board 7 are indicated by mounting arrangements A, B, C, and D, respectively, and positions of four heat generating components 9 mounted on the circuit board 8 are indicated by mounting arrangements E, F, G, and H, respectively. The number and positions of the heat generating components 9 mounted on the circuit boards 7 and 8 are not limited to the examples of FIGS. 2 and 3, and may be any number and position.

Although not illustrated, passive elements such as capacitors are also mounted on the circuit boards 7 and 8, and wiring patterns for connecting these electronic components to connectors and the like (not illustrated) are also formed. The circuit boards 7 and 8 are made of, for example, an organic material such as an epoxy resin. The circuit boards 7 and 8 are preferably made of an FR4 (glass epoxy board) material from the viewpoint of heat resistance and insulation properties. The circuit boards 7 and 8 can be single-layer boards or multilayer boards.

The heat generating components 9 are arranged so as to face a lower surface of the upper circuit board 7 and an upper surface of the lower circuit board 8. The heat generating components 9 on the circuit boards 7 and 8 are arranged at positions not overlapping each other in plan view. The heat generating components 9 are electrically connected to the circuit boards 7 and 8 with a bonding material such as solder. The plan view mentioned herein refers to visual recognition in a direction perpendicular to the circuit boards 7 and 8, that is, in a thickness direction (stacking direction) of the circuit boards 7 and 8 on the assumption that the circuit boards are horizontal.

Heat generated from the heat generating components 9 is transmitted to the housings 1 and 2 via a thermal conductive material 10, and is dissipated to the atmosphere from the heat dissipation fins 3 and 4 respectively formed in a lower portion of the housing 1 and an upper portion of the housing 2. Alternatively, heat is transmitted to outer surfaces of the housings 1 and 2, that is, surfaces of the housings 1 and 2 facing surfaces of the circuit boards 7 and 8 opposite to a mounting surface of the heat generating components 9 by providing wiring patterns and thermal vias (or through-holes) (not illustrated) on the circuit boards 7 and 8, and it is also possible to effectively dissipate heat from the outer surfaces of the housings 1 and 2. However, in order increase degrees of freedom for an attachment position of the electronic control device 100 and an attachment partner, it may be advantageous to have a configuration for restricting thermal conduction to the outer surfaces of the housings 1 and 2.

The upper housing 1 and the lower housing 2 may be made of, for example, a metal material having excellent thermal conductivity, such as an alloy-type aluminum. ADC 12 often used for automobile parts as aluminum die casting. The housings are made of a metal sheet such as iron or a non-metallic material such as a resin material, and thus, it is also possible to achieve cost reduction and weight reduction. Similarly, the cover (housing) 5 can be made of a sheet metal such as iron or a non-metallic material such as a resin material.

Inside the housings 1 and 2, the heat generating components 9 are in contact with the thermal conductive material 10 above or below the heat generating components 9, and the thermal conductive material 10 is in contact with boss portions (not illustrated). The boss portions may be a part of the housings 1 and 2, or may be a member in contact with inner surfaces of the housings 1 and 2. The heat dissipation fins 3 and 4 extend from the outer surfaces of the housings 1 and 2 so as to protrude toward each other.

The heat dissipation fins 3 and 4 and the boss portions may be integrally formed as a part of the housings 1 and 2 by casting such as die casting. Alternatively, the heat dissipation fins 3 and 4 and the boss portions may be produced as members separate from the housings 1 and 2 and may be attached to the housings 1 and 2. The heat of the heat generating components 9 may be conducted to the base portion where the heat dissipation fins 3 and 4 of the electronic control device 100 are implanted. As long as the heat dissipation fins 3 and 4 are thermally coupled to the heat generating components 9, the heat dissipation fins may have other structures.

In the example illustrated in FIG. 1, three air cooling fans 6 are arranged so that air flows in a ventilation path between the heat dissipation fins 3 and 4 including the upper heat dissipation fin 3 and the lower heat dissipation fin 4. One or a plurality of air cooling fans 6 may be arranged. The air cooling fan 6 may be an axial fan, a centrifugal fans, or a blower. A water-cooling structure in which a refrigerant is not air but liquid and the liquid flows between the fins to be cooled may be employed.

Figure 4:
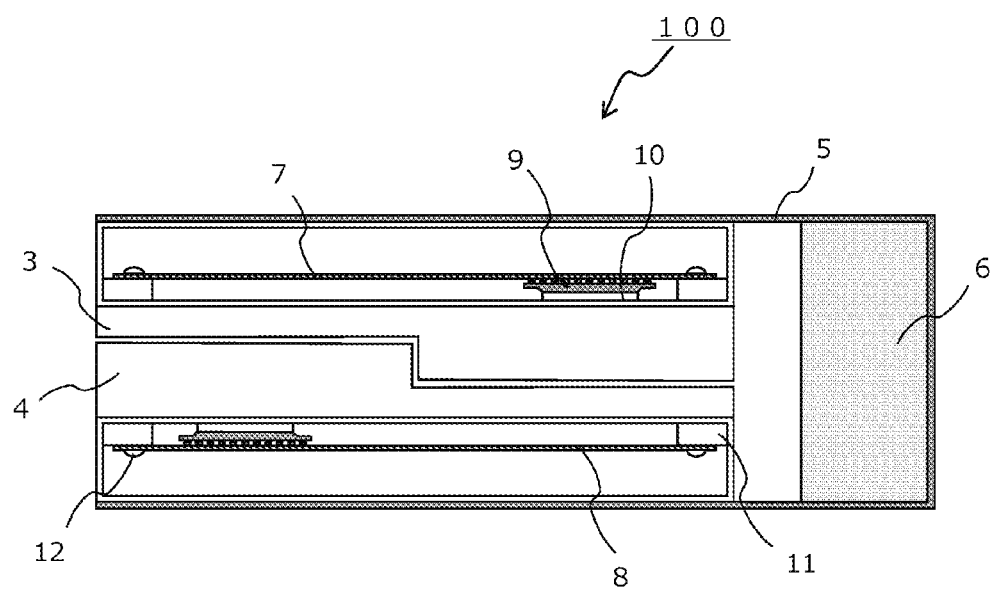
FIG. 4 is a diagram illustrating an example of across section taken along a line X-X of the electronic control device.
Figure 5:
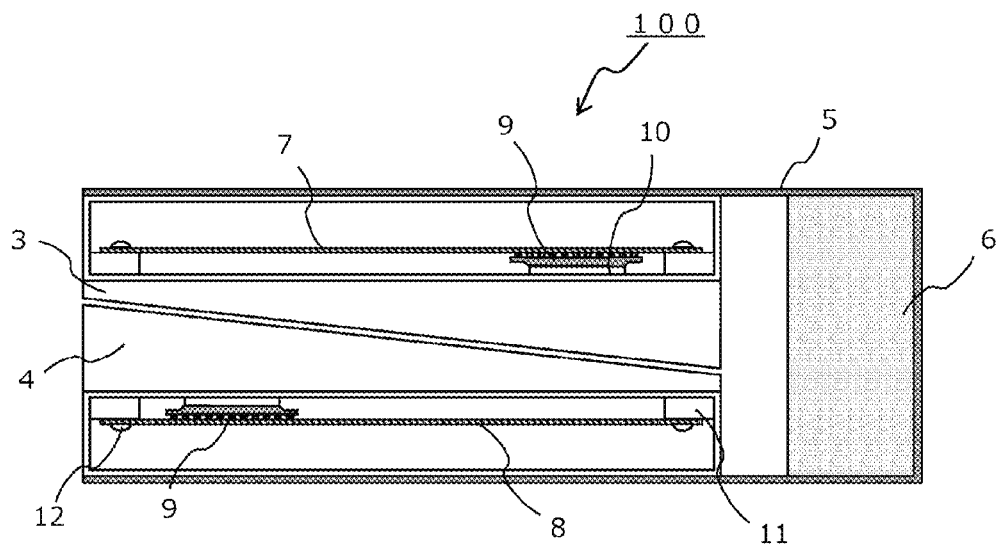
FIG. 5 is a diagram illustrating another example of the cross section taken along the line X-X of the electronic control device.
Figure 6:
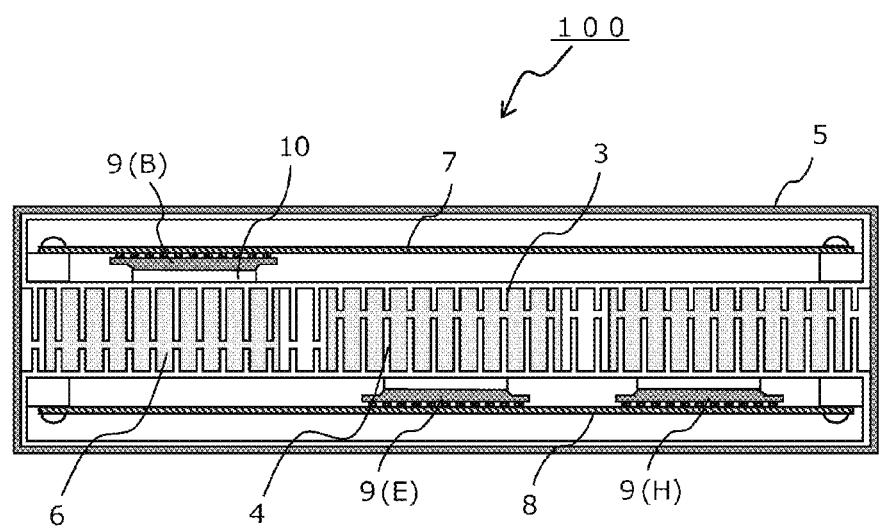
FIG. 6 is a diagram illustrating an example of a cross section taken along a line Y-Y of the electronic control device.

FIG. 4 is a cross-sectional view taken along a line X-X of the electronic control device 100 illustrated in FIG. 1. FIG. 5 is a modification example in which a fin shape in the cross-sectional view taken along the line X-X illustrated in FIG. 4 is changed. FIG. 6 is a cross-sectional view taken along a line Y-Y of the electronic control device 100 illustrated in FIG. 1. As illustrated in FIGS. 4 to 6, in the housings 1 and 2, boss portions 11 protruding toward the circuit boards 7 and 8 are provided at corner portions of surfaces on which the heat dissipation fins 3 and 4 are arranged. FIGS. 4 to 6 illustrate cross sections when the heat generating components 9 are mounted on the boards 7 and 8 in the arrangement illustrated in FIG. 2.

The circuit boards 7 and 8 are fixed to end surfaces of the boss portions 11 by screws 12. The heat generating components 9 are arranged on the surfaces of the circuit boards 7 and 8 on the side of the heat dissipation fins 3 and 4, and the thermal conductive material 10 is provided above the heat generating components 9. Boss portions (not illustrated) may be provided between the thermal conductive material 10 and the housings 1 and 2.

As the thermal conductive material 10, there are various types of thermal conductive materials such as a grease shape, a gel shape, and a sheet shape, and an appropriate thermal conductive material may be adopted. The thermal conductive material 10 generally used is a grease-shaped thermal conductive material, and examples thereof include a thermosetting resin having adhesiveness and a semi-cured resin having low elasticity.

The thermal conductive material 10 contains a filler made of metal, carbon, ceramic, or the like and having good thermal conductivity. The thermal conductive material 10 is preferably a semi-cured resin using a silicon-based resin containing a ceramic filler, for example, which has flexibility deformable with respect to deformation or vibration due to heat of the circuit boards 7 and 8 and tolerance during manufacture.

In FIGS. 4 and 5, among the heat generating components 9 illustrated in FIG. 2, the heat generating component 9 mounted on the upper circuit board 7 in the mounting arrangement D and the heat generating component 9 mounted on the lower circuit board 8 in the mounting arrangement E are illustrated. In the case of FIG. 4, protrusion heights of the heat dissipation fins 3 and 4 arranged at abutment positions of the heat generating component 9 are high, and protrusion heights of the heat dissipation fins 3 and 4 extending in a region where the heat generating components 9 are not arranged are low. The protrusion heights of the circuit boards 7 and 8 are switched like steps with a center position of each heat generating component 9 as a boundary.

In the case of FIG. 5, the protrusion height of the heat dissipation fin 3 continuously increases and the protrusion height of the heat dissipation fin 4 continuously decreases from a left region in the drawing where the heat generating component 9 is mounted on the circuit board 8 toward a right region in the drawing where the heat generating component 9 is mounted on the circuit board 7. That is, since the fin height (protrusion height) is changed diagonally from both ends of the heat dissipation fins 3 and 4, the shapes of the heat dissipation fins 3 and 4 are trapezoidal.

The fin shape is not limited to the example of FIGS. 4 and 5, and may be another fin shape, for example, a triangular shape, or may be a pin fin instead of a flat plate fin in consideration of water cooling. Although the shapes, the arrangements, and the like of the heat dissipation fins 3 and 4 may be different from each other in the drawings, the same reference signs are given.

In either case of FIGS. 4 and 5, at a position where the heat generating component 9 is arranged on the circuit board 7, the heat dissipation fin 3 corresponding to the circuit board 7 has a longer length than the heat dissipation fin 4 in the stacking direction (thickness direction) of the circuit boards 7 and 8. Similarly, at the position where the heat generating component 9 is disposed on the circuit board 8, the heat dissipation fins 4 corresponding to the circuit board 8 has a longer length than that of the heat dissipation fins 3 in the stacking direction (thickness direction) of the circuit boards 7 and 8. As stated above, since heat from the heat generating component 9 can be efficiently dissipated by the heat dissipation fins 3 and 4 by setting the heat dissipation fins 3 and 4 arranged near the heat generating component 9 to be higher, it is effective in improving heat dissipation performance.

In FIG. 6, among the heat generating components 9 illustrated in FIG. 2, the heat generating component 9 mounted on the upper circuit board 7 in the mounting arrangement B and the heat generating component 9 mounted on the lower circuit board 8 in the mounting arrangements E and H are illustrated. That is, the heat generating component 9(B) mounted on the upper circuit board 7 in FIG. 6 is the heat generating component 9 in the mounting arrangement B in FIG. 2. The heat generating component 9(E) at the center of the lower circuit board 8 in FIG. 6 is the heat generating component 9 in the mounting arrangement E in FIG. 2. The heat generating component 9(H) on a right side of the lower circuit board 8 in FIG. 6 is the heat generating component 9 in the mounting arrangement H in FIG. 2.

As illustrated in FIG. 6, the protrusion heights of the heat dissipation fins 3 and 4 arranged at the abutment positions of the heat generating component 9 are high, and the protrusion heights of the heat dissipation fins 3 and 4 extending in a region where the heat generating components 9 are not arranged are relatively low. As described above, in FIG. 6, as in the example of FIGS. 4 and 5, at the position where the heat generating component 9 is disposed on the circuit board 7, the heat dissipation fin 3 corresponding to the circuit board 7 has a longer length than the length of the heat dissipation fin 4 in the stacking direction (thickness direction) of the circuit boards 7 and 8. At the position where the heat generating component 9 is disposed on the circuit board 8, the heat dissipation fins 4 corresponding to the circuit board 8 has a longer length than the length of the heat dissipation fins 3 in the stacking direction (thickness direction) of the circuit boards 7 and 8.

Figure 7:
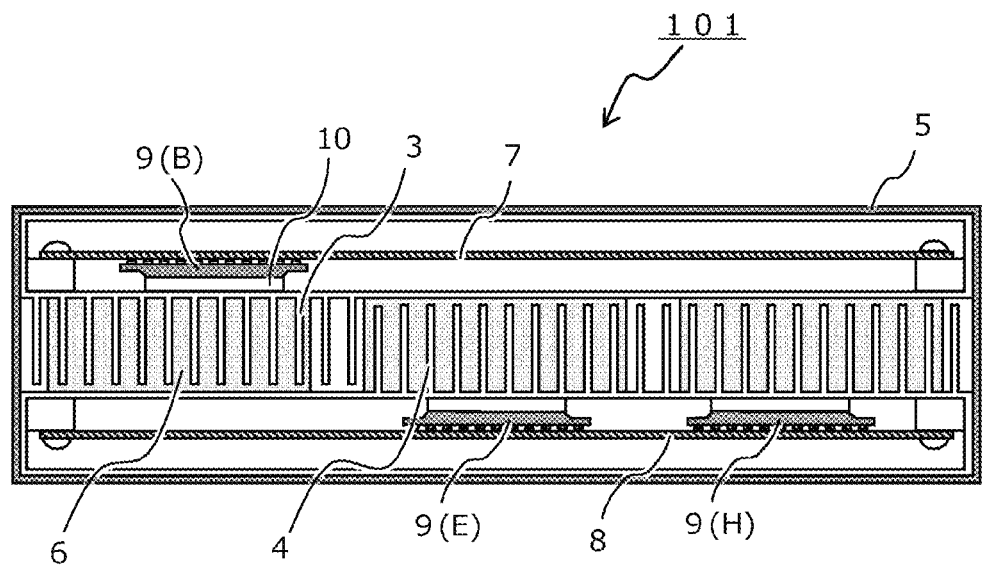
FIG. 7 is a diagram illustrating another example of the cross section taken along the line Y-Y of the electronic control device.

FIG. 7 is a cross-sectional view taken along a line Y-Y of an electronic control device 101 according to a modification example in which the shapes of the heat dissipation fins 3 and 4 are changed, and corresponds to FIG. 6. In this modification example, as illustrated in FIG. 7, only the heat dissipation fins 3 or the heat dissipation fins 4 are provided in the housings 1 and 2 according to the position where the heat generating components 9 are arranged in the stacking direction (thickness direction) of the circuit boards 7 and 8.

At the positions where the heat generating components 9 are arranged on the circuit board 7, the heat dissipation fins 4 are not provided, and only the heat dissipation fins 3 are provided. At the positions where the heat generating components 9 are arranged on the circuit board 8, only the heat dissipation fins 4 are provided without the heat dissipation fin 3. Since the heat dissipation fins 3 and 4 arranged near the heat generating components 9 can be heightened by arranging the heat dissipation fins 3 and 4 in this manner, heat is efficiently transmitted from the heat generating components 9 to the heat dissipation fins 3 and 4, and thus, heat dissipation performance can be improved.

Figure 8:
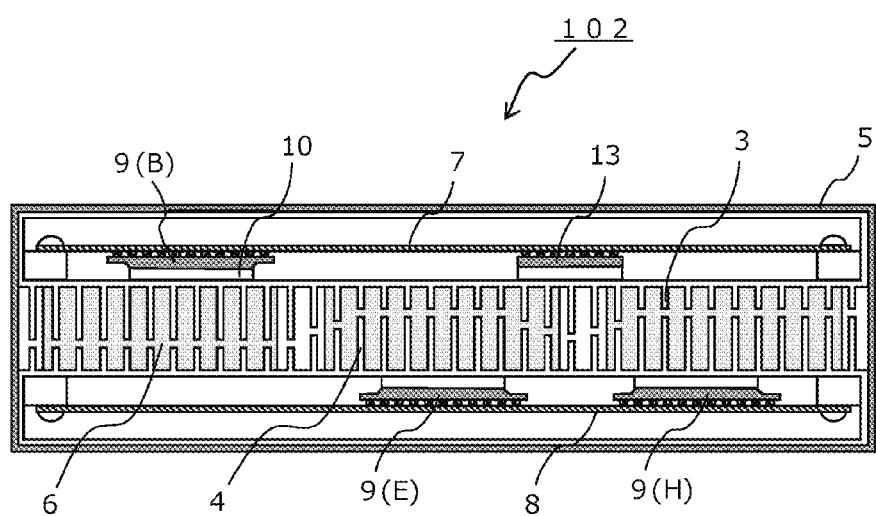
FIG. 8 is a diagram illustrating still another example of the cross-sectional view taken along the line Y-Y of the electronic control device.

FIG. 8 is a cross-sectional view taken along a line Y-Y illustrating an electronic control device 102 according to a modification example in which the arrangement of the heat generating components 9 and the shapes of the heat dissipation fins 3 and 4 are changed, and corresponds to FIG. 6. In this modification example, as illustrated in FIG. 8, another heat generating component 13 is further disposed on the upper circuit board 7. The heat generating component 13 may be, for example, a component that generates less heat or consumes less power than the heat generating component 9.

In the electronic control device 102 of FIG. 8, the heat generating component 13 mounted on the circuit board 7 and the heat generating component 9 mounted on the circuit board 8 are arranged at positions partially overlapping each other in plan view in the stacking direction (thickness direction) of the circuit boards 7 and 8. In the plan view, at the position where the heat generating component 13 is disposed, the length of the heat dissipation fins 3 in the stacking direction (thickness direction) of the circuit boards 7 and 8 is different between the position where the heat generating component 9 mounted on the circuit board 8 overlaps and the position where the heat generating component does not overlap.

Specifically, among the positions where the heat generating components 13 are arranged in plan view, the length of the heat dissipation fins 3 at the position where the heat generating component 13 and the heat generating component 9 overlap is shorter than the length of the heat dissipation fins 3 at the position where the heat generating component 13 and the heat generating component 9 do not overlap. Accordingly, at the position where the heat generating component 9 and the heat generating component 13 overlap in plan view, the heat dissipation fins 3 can be provided on the housing 1 side, and the heat dissipation fins 4 can also be provided on the housing 2 side.

In addition to the fact that the protrusion heights of the heat dissipation fins 3 and 4 arranged at the abutment positions of the heat generating component 9 are high and the protrusion heights of the heat dissipation fins 3 and 4 arranged in a region not in contact with the heat generating component 9 are low, the heat dissipation fins 3 arranged at the abutment positions of the heat generating component 13 are also formed to be high to some extent. As described above, when the heat generating component 9 and the heat generating component 13 are arranged so as to overlap each other in plan view from the stacking direction (thickness direction) of the circuit boards 7 and 8, it is desirable to compare the heat generation amount and power consumption to extend the heat dissipation fins 3 and 4 up to a height at which the heat dissipation performance of the fins is exhibited according to each heat generation amount. As described above, the lengths of the heat dissipation fins 3 and 4 are determined according to the power consumption of the heat generating component 9 and the heat generating component 13, and thus, the heat dissipation performance of each of the heat dissipation fins 3 and 4 can be optimized.

As illustrated in FIG. 8, the lengths of the heat dissipation fins 3 and 4 arranged at the abutment position of the heat generating component 9 and the heat generating component 13 are formed so as to be the longest near a central axis of these components and to be shorter with increasing distance from the central axis. As stated above, an effect of efficiently dissipating heat through the entire housing with respect to the size of the ventilation path, the size and material of the heat dissipation fins 3 and 4, and the amount of air blown by the air cooling fans 6 is obtained.

Subsequently, the heat dissipation effect of the electronic control device 100 according to the embodiment described above and the electronic control device 101 according to the modification example will be described with reference to Examples 1 and 2 below.

EXAMPLE 1

As an example of the electronic control device 100, as described above, the configuration illustrated in the appearance of FIG. 1, the mounting arrangements A to H of the heat generating components 9 on the circuit boards 7 and 8 of FIG. 2, and the cross sections of the housing of FIGS. 4 and 6 may be adopted. Hereinafter, an example of a more specific configuration of the electronic control device 100 will be described. The circuit boards 7 and 8 are fixed to the boss portions 11 provided at the four corners of the housing with the screws 12. The upper housing 1 includes the upper circuit board 7 having the heat generating component 9, and the lower housing 2 includes the lower circuit board 8 having the heat generating component 9.

The circuit boards 7 and 8 were made of an FR4 material having a size of 320 mm×180 mm×1.6 mm (thickness). The circuit boards 7 and 8 are 8-layer boards, and have thermal conductivities of 69 W/mK in an in-plane direction and 0.45 W/mK in a vertical direction. The heat generating component 9 having a large heat generation amount is a ball grid array (BGA) type semiconductor device of 40 mm×40 mm×3.4 mm (thickness), for example, a CPU. The heat generating components 9 may be mounted on the circuit boards 7 and 8 by soldering.

As illustrated in FIG. 2, the heat generating components 9 on the upper circuit board 7 and the heat generating components 9 on the lower circuit board 8 are arranged at different positions in plan view. The mounting arrangements of the heat generating components 9 on the circuit boards 7 and 8 correspond to the mounting arrangements A to D of the circuit board 7 and the mounting arrangements E to H of the circuit board 8, respectively. These circuit boards 7 and 8 may have a relationship of being inverted about a diagonal line not including the mounting arrangements A and H.

The thermal conductive material 10 was made of a low elastic heat dissipation material (thermal conductivity: 2 W/mK) containing a thermal conductive filler in a silicon-based resin. The thermal conductive material 10 was provided on the upper surfaces of all the heat generating components 9, and had the same size as that of the heat generating components 9 and a thickness of 1.9 mm (constant). The upper housing 1 and the lower housing 2 were made of an ADC 12 having a thermal conductivity of 96 W/mK. The cover 5 was made of a resin having a thermal conductivity of 0.33 W/mK.

The heat dissipation fins 3 and 4 had a thickness of 2 mm and an interval of 8 mm, a height of 24 mm at the abutment position of the heat generating component 9, and a height of 10 mm at other positions. In the electronic control device 100 according to Example 1, the fin region (ventilation path) between the upper housing 1 and the lower housing 2 had a height of 36 mm. As the air cooling fans 6, three DC axial flow fans of 92 mm×38 mm (thickness) were arranged. A maximum air volume is 5.05 m³/min, and a maximum static pressure is 400 Pa.

Figure 9:
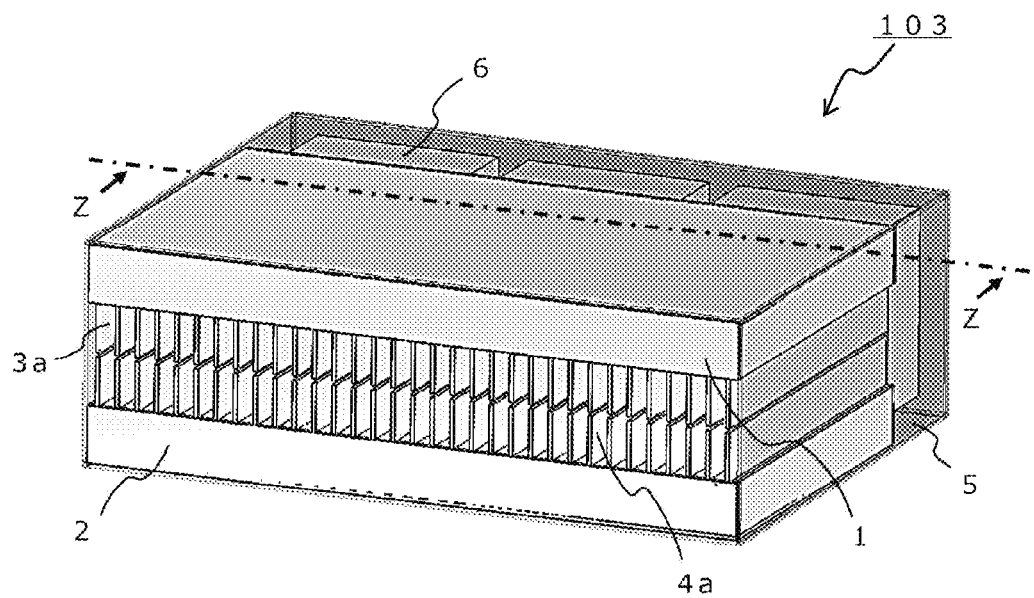
FIG. 9 is an external perspective view of an electronic control device according to Comparative Example 1.
Figure 10:
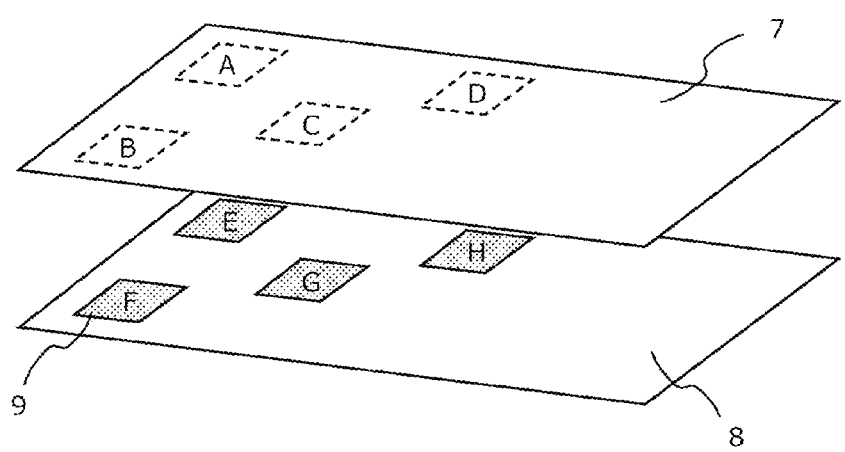
FIG. 10 is a diagram illustrating component arrangement of a circuit board built in the electronic control device according to Comparative Example 1.
Figure 11:
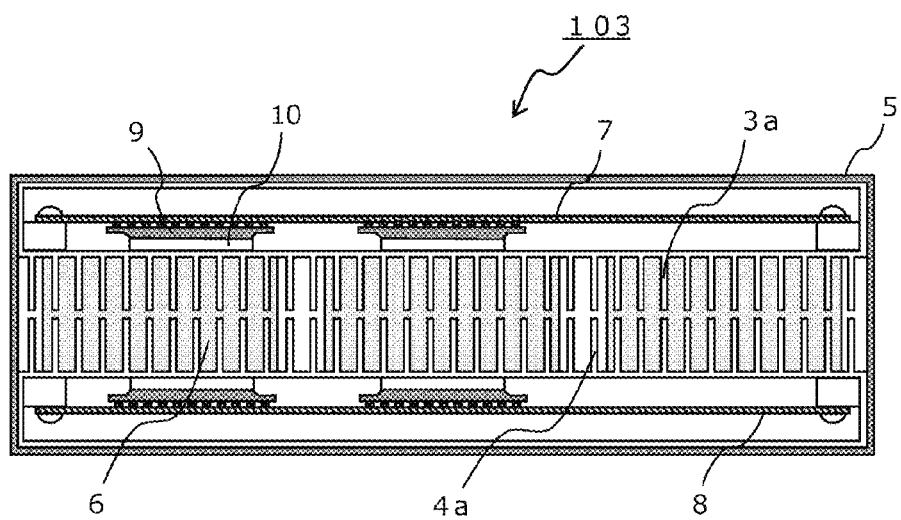
FIG. 11 is a diagram illustrating a cross section taken along a Z-Z line of the electronic control device according to Comparative Example 1.

FIG. 9 is an external perspective view of an electronic control device 103 according to Comparative Example 1. FIG. 10 is a perspective view of the circuit boards 7 and 8 built in the electronic control device 103 of FIG. 9. FIG. 11 is a cross-sectional view taken along a line Z-Z in FIG. 9. The positions of the heat generating components 9 on each of the circuit boards 7 and 8 of the electronic control device 101 and the shapes of the heat dissipation fins 3a and 4a are different from those of the electronic control device 100. Heat dissipation fins 3a and 4a used in the electronic control device 100 illustrated in FIGS. 9 to 11 are denoted by different reference signs from the heat dissipation fins 3 and 4 used in the electronic control device 103.

In the electronic control device 103 illustrated in FIG. 10, the heat generating components 9 arranged on the upper circuit board 7 and the lower circuit board 8 are arranged at overlapping positions in plan view. As illustrated in FIG. 11, all the heights of the heat dissipation fins are constant at 24 mm. In Comparative Example 1, the fin region between the upper housing 1 and the lower housing 2, that is, the ventilation path has a height of 50 mm. The height of the electronic control device 103 according to Comparative Example 1 is not reduced. Except for this point, the electronic control device 103 is the same as the electronic control device 100 according to Example 1 in which the heights of the basic structure inside the housing and the used members are reduced.

Figure 12:
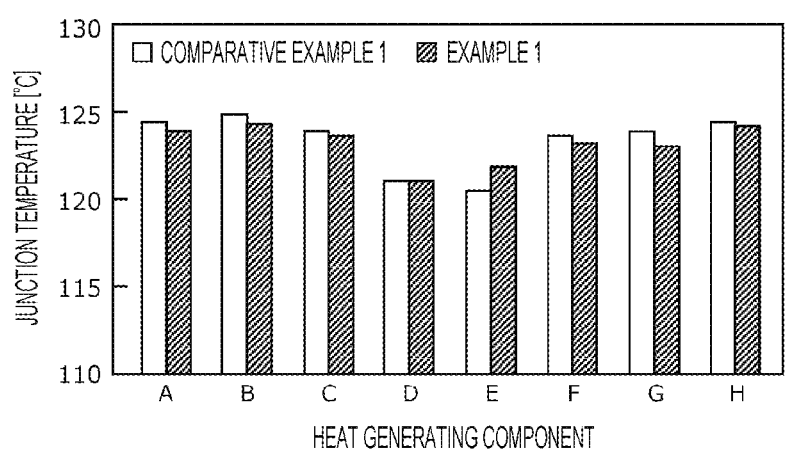
FIG. 12 is a comparative diagram of junction temperatures.

FIG. 12 is a comparison diagram of junction temperatures of the electronic control device 100 according to Example 1 and the electronic control device 103 according to Comparative Example 1. FIG. 12 illustrates a result of thermal fluid analysis of the junction temperatures of the heat generating components 9 for the component arrangements A to H for the configurations of the electronic control device 100 according to Example 1 and the electronic control device 103 according to Comparative Example 1. The junction temperatures illustrated in FIG. 12 are junction temperatures in a forced air cooling environment by the air cooling fans 6 at an environmental temperature of 80° C. in which a heat generation amount per one of the heat generating components 9 is 28 W and a heat generation amount of the entire electronic control device 100 is 224 W.

As illustrated in FIG. 12, the electronic control device 100 according to Example 1 has substantially the same result as the electronic control device 103 according to Comparative Example 1 for the junction temperatures of the heat generating components 9. The electronic control device 100 according to Example 1 has a height reduction structure in which the height of the heat dissipation fins is reduced by 14 mm (the height is reduced by 28% in the fin region) as compared with the electronic control device 103 according to Comparative Example 1. In such a height reduction structure, substantially the same heat dissipation performance could be confirmed even though the heat dissipation condition was severer than that of the height reduction structure. Accordingly, the electronic control device 100 can achieve both high heat dissipation and height reduction.

EXAMPLE 2

Hereinafter, an example of a specific configuration of the electronic control device 101 according to Example 2 will be described. As illustrated in the cross section of the housing of FIG. 7, the electronic control device 101 according to Example 2 is different from the electronic control device 100 according to Example 1 in the shapes and the arrangements of the heat dissipation fins 3 and 4, but the other configurations of the electronic control device 101 according to Example 2 are the same as those of the electronic control device 100 according to Example 1. The heat dissipation fins 3 and 4 had a thickness of 2 mm and an interval of 8 mm, and the heat dissipation fins were formed only above or below the heat generating component 9. The heat dissipation fins 3 and 4 had a height of 34 mm. In the electronic control device 101 according to Example 2, the fin region (ventilation path) between the upper housing 1 and the lower housing 2 had a height of 36 mm. These fin shapes are slightly different between the electronic control device 100 according to Example 1 and the electronic control device 101 according to Example 2, but are denoted by the same reference signs of the heat dissipation fins 3 and 4.

Figure 13:
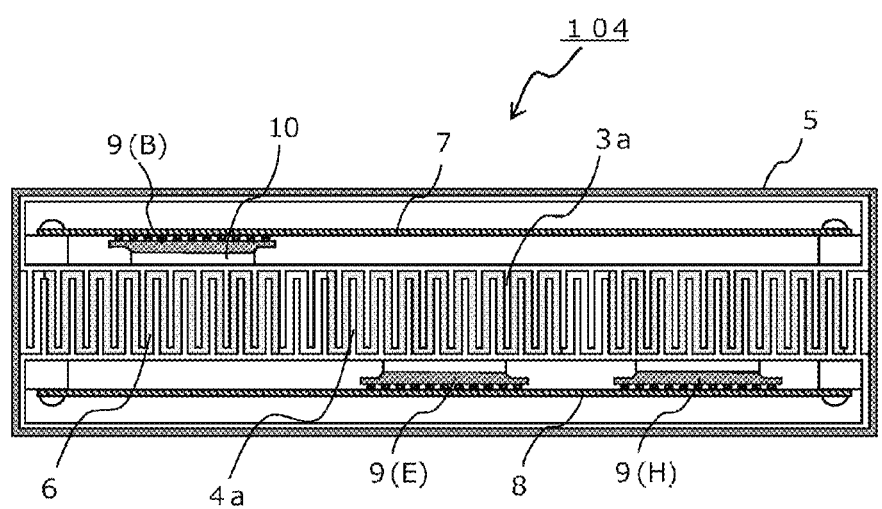
FIG. 13 is a diagram illustrating a cross section of an electronic control device according to Comparative Example 2.

FIG. 13 is a cross-sectional view of the housing for explaining a ventilation path of an electronic control device 104 according to Comparative Example 2 in front view. Although the members used in the electronic control device 104 according to Comparative Example 2 are substantially the same as those of the electronic control device 101 according to Example 2 illustrated in FIG. 7, only the fin shape is different from that of the electronic control device 101 illustrated in FIG. 7. The heat dissipation fins 3a and 4a used in the electronic control device 104 of FIG. 13 are denoted by different reference signs for clear distinction from the heat dissipation fins 3 and 4 of the electronic control device 100 or 102.

As illustrated in FIG. 13, since the heat dissipation fins 3a and 4a having a thickness of 2 mm and an interval of 8 mm are arranged so as to be combined with each other, the interval between the upper heat dissipation fin 3a and the lower heat dissipation fin 4a is 3 mm. The heat dissipation fins 3 and 4 had a height of 34 mm. In the electronic control device 104 according to Comparative Example 2, the fin region (ventilation path) between the upper housing 1 and the lower housing 2 had a height of 36 mm. In comparison between the electronic control device 101 according to Example 2 and the electronic control device 104 according to Comparative Example 2, the height of the fin region by the ventilation path formed between the upper housing 1 and the lower housing 2 is constant.

When air from the air cooling fans 6 passes between the fins of the ventilation path, a pressure loss due to friction occurs between a fluid and a flow path wall surface. Thus, the performance of the air cooling fans 6 deteriorates, and sufficient air cannot be caused to flow. Accordingly, the deterioration of heat dissipation becomes a problem. Accordingly, in order to compare both the electronic control device 101 according to Example 2 and the electronic control device 104 according to Comparative Example 2, the pressure loss due to the friction between the fins was calculated.

The pressure loss can be derived by the following equation ($\Delta Ploss = \zeta \times (\rho/2) \times u^2$). Here, $\zeta$ is a pressure loss coefficient, $\rho$ is a density of the fluid, and u is an average flow velocity. The pressure loss was 82 Pa in the electronic control device 101 according to Example 2 illustrated in FIG. 7, whereas the pressure loss was 271 Pa and increased about 3 times in the electronic control device 104 according to Comparative Example 2 illustrated in FIG. 13. It is considered that the average flow velocity u increased and the pressure loss increased as the fin interval narrowed.

From the above, the electronic control device 100 or 101 has improved fin efficiency, and is effective in reducing the height and increasing the heat dissipation. For the mounting arrangements of the heat generating components 9, it is preferable that the heat generating components mounted on the upper circuit board 7 and the heat generating components mounted on the lower circuit board 8 are arranged at different positions in plan view from the thickness direction of the circuit boards 7 and 8. Preferably, the fin implanted in the base portion at a position closer to the abutment position of the heat generating component 9 is disposed to have a higher protrusion height from the base portion. It is possible to suppress an increase in the pressure loss by arranging the fin interval to be constant, and it is possible to achieve height reduction and high heat dissipation while maintaining the performance of the air cooling fans 6. In Examples 1 and 2, although the description of the heat dissipation effect of the electronic control device 102 according to the modification example illustrated in FIG. 8 is omitted, the same heat dissipation effect as in Examples 1 and 2 is obtained in this case.

As described above, each of the electronic control devices 100 to 102 is a forced cooling structural body having two circuit boards 7 and 8 arranged in parallel at a constant interval and having the ventilation path penetrating the gap between the circuit boards. The heat dissipation fins 3 and 4 provided on inward surfaces of the upper and lower housings 1 and 2 are provided between the circuit boards 7 and 8. In plan view from the thickness direction of the circuit boards 7 and 8, the mounting arrangements of the heat generating components 9 on the upper and lower two circuit boards 7 and 8 are shifted, and the heat dissipation fins 3 and 4 are arranged so as to overlap the abutment positions of the heat generating components 9.

Each of the electronic control devices 100 to 102 can achieve both high heat dissipation and height reduction without significantly increasing the temperatures of the outer surfaces of the housings 1 and 2 while suppressing the increase in the pressure loss between the heat dissipation fins 3 and 4. Each of the electronic control devices 100 to 102 is particularly suitable for an on-vehicle electronic control device mounted on an automobile. When each of the electronic control devices 100 to 102 is applied to the on-vehicle electronic control device, since both high heat dissipation and height reduction can be achieved without extremely increasing the temperatures of the outer surfaces of the housings 1 and 2, the degrees of freedom for the attachment position and the attachment partner increase, and thus, versatility applicable to multi-model multi-specification can be secured over a long period.

The present invention is not limited to the aforementioned embodiments, and includes various modification examples. Furthermore, some of the components of a certain example can be substituted into the components of another example, and the components of another example can be added to the component of a certain embodiment.

Each of the electronic control devices 100 to 102 is an electronic control device including the heat dissipation fins 3 and 4 that air-cool the heat generating components 9 and 13 built in the rectangular parallelepiped housings 1 and 2. That is, each of the electronic control devices 100 to 102 has a multi-layer structure, and the ventilation path penetrating the gap between layers is formed. The heat dissipation fins 3 and 4 are provided to protrude in a width direction from an inner wall surface of the ventilation path of each of the electronic control devices 100 to 102. The heat generating components 9 and 13 are arranged so as to thermally conduct the base portions of each of the electronic control devices 100 to 102 where the heat dissipation fins 3 and 4 are implanted. Each of the electronic control devices 100 to 102 preferably includes a forced air cooling mechanism that sends air to the ventilation path.

The heat dissipation fins 3 and 4 are not provided so as to protrude on the outer surface of the housing 5, and a flat surface is secured. Accordingly, there are few restriction conditions on a partner in contact with the outer surface of the housing. That is, each of the electronic control devices 100 to 102 has a structure that is easy to attach.

As described above, each of the electronic control devices 100 to 102 can provide an electronic control device that increases the degrees of freedom for the attachment position and the attachment partner. The heat generating components 9 and 13 can be favorably cooled without increasing the temperature of the outer surface of each of the electronic control devices 100 to 102. Preferably, the heat dissipation fins 3 and 4 of each of the electronic control devices 100 to 102 are arranged to face each other. Accordingly, since a large heat exchange area can be secured in the ventilation path, a heat dissipation design for obtaining a necessary cooling effect is easy.

Since the heat generation amount is larger at a position closer to the heat generating components 9 and 13, it is easy to secure the necessary cooling effect by increasing the protrusion heights of the heat dissipation fins 3 and 4 to expand the heat exchange area. The protrusion heights of the heat dissipation fins 3 and 4 are preferably changed according to the heat generation amount of the heat generating components 9 and 13, and may be unevenly formed. Preferably, widths of gaps constituting the ventilation path in a state where the heat dissipation fins 3 and 4 are not provided is uniform. In the ventilation path having the equal width, when one of the pair of heat dissipation fins 3 and 4 is high, the other dissipation fin is low and is disposed to face the one dissipation fin. As a result, the heat exchange area is efficiently obtained as a whole in the ventilation path having a limited uniform width.

The following electrical device is also an example of the embodiment. An electrical device (for example, the electronic control devices 100 to 102) includes a first housing (for example, the housing 1) which has therein a first circuit board (for example, the circuit board 7) on which at least a first electronic component (for example, the heat generating component 9) is mounted, a second housing (for example, the housing 2) which has therein a second circuit board (for example, the circuit board 8) on which at least a second electronic component (for example, the heat generating component 9) is mounted, and at least one or more fans (for example, the air cooling fans 6) that send air passing between the first housing and the second housing.

The first housing has a plurality of fins (for example, the heat dissipation fins 3) facing the second housing. The second housing has a plurality of fins (for example, the heat dissipation fins 4) facing the first housing. In at least one of cross sections of the first circuit board in a thickness direction, the electrical device has a structure having a region in which the fin of the first housing is longer than the fin of the second housing and a region in which the fin of the first housing is shorter than the fin of the second housing.

At least a part of heat generated in the first electronic component is transmitted to a part of the fins of the first housing. At least a part of heat generated in the second electronic component is transmitted to a part of the fins of the second housing. The fins of the first housing and the fins of the second housing are cooled by air from at least one or more fans.

Each of the first electronic component and the second electronic component maybe, for example, an integrated circuit. In plan view from the thickness direction of the first circuit board, the first electronic component and the second electronic component may be arranged at different positions. In the fin of the first housing and the fin of the second housing arranged so as to overlap the first electronic component in plan view from the thickness direction of the first circuit board, the fin of the first housing is longer than the fin of the second housing in a cross section (for example, the cross section in FIGS. 6 and 8) of the first circuit board in the thickness direction.

For the fin of the first housing and the fin of the second housing, which are arranged so as to overlap the second electronic component in plan view from the thickness direction of the first circuit board, the fin of the first housing is shorter than the fin of the second housing in a cross section (for example, the cross section in FIGS. 6 and 8) of the first circuit board in the thickness direction.

A third electronic component (for example, electronic component 13) that is an integrated circuit may be mounted on the first circuit board. In plan view from the thickness direction of the first circuit board, the third electronic component and the second electronic component may be arranged at positions partially overlapping each other. In plan view from the thickness direction of the first circuit board, the fin of the first housing disposed at the position where the third electronic component and the second electronic component overlap each other and the fin of the first housing disposed at the position where the third electronic component and the second electronic component do not overlap each other among the positions where the third electronic component is disposed have different lengths in a cross section (for example, the cross section in FIG. 8) of the first circuit board in the thickness direction.

In plan view from the thickness direction of the first circuit board, the fin of the first housing disposed at the position where the third electronic component and the second electronic component overlap each other has a shorter length in a cross section (for example, the cross section in FIG. 8) of the first circuit board in the thickness direction than the fin of the first housing disposed at the position where the third electronic component and the second electronic component do not overlap each other among the positions where the third electronic component is disposed.

The second electronic component may consume more power than the third electronic component. In plan view from the thickness direction of the first circuit board, for the fin of the first housing and the fin of the second housing arranged at positions where the third electronic component and the second electronic component overlap each other, the fin of the first housing has a shorter length in a cross section (for example, the cross section in FIG. 8) of the first circuit board in the thickness direction than the fin of the second housing.

In plan view from the thickness direction of the first circuit board, the plurality of fins of the second housing arranged at positions overlapping the second electronic component has a shorter length as the fins are farther from the center of the second electronic component in a cross section (for example, the cross section in FIG. 8) of the first circuit board in the thickness direction.

In plan view from the thickness direction of the first circuit board, the plurality of fins of the first housing arranged at positions overlapping the second electronic component has a longer length as the fins are farther from the center of the second electronic component in a cross section (for example, the cross section in FIG. 8) of the first circuit board in the thickness direction.

The first electronic component may be an integrated circuit. For example, as illustrated in the example of FIG. 7, in plan view from the thickness direction of the first circuit board, the first electronic component and a part of the fins of the first housing are arranged so as to overlap each other, and the first electronic component and the fins of the second housing are arranged so as not to overlap each other.

The second electronic component may be an integrated circuit. For example, as illustrated in the example of FIG. 7, in plan view from the thickness direction of the first circuit board, the second electronic component and a part of the fins of the second housing are arranged so as to overlap each other, and the second electronic component and the fins of the first housing are arranged so as not to overlap each other.

For example, as illustrated in the example of FIG. 7, in plan view from the thickness direction of the first circuit board, the first electronic component is disposed at a position where the integrated circuit is not mounted on the second circuit board, and the second electronic component is disposed at a position where the integrated circuit is not mounted on the first circuit board.

For example, as illustrated in the examples of FIGS. 6 and 8, the interval between the plurality of fins of the first housing and the interval between the plurality of fins of the second housing may be the same. The following electronic control device is also an example of the embodiment.

An electronic control device (for example, the electronic control devices 100 to 102) includes a first housing (for example, the housing 1) which has therein a first circuit board (for example, the circuit board 7) on which at least a first electronic component (for example, the heat generating component 9) is mounted, a second housing (for example, the housing 2) which has therein a second circuit board (for example, the circuit board 8) on which at least a second electronic component (for example, the heat generating component 9) is mounted, and a third housing (for example, the housing 5) which has therein the first housing and the second housing.

The first housing has a plurality of fins (for example, the heat dissipation fins 3) facing the second housing. The second housing has a plurality of fins (for example, the heat dissipation fins 4) facing the first housing. At least a part of heat generated in the first electronic component is transmitted to a part of the fins of the first housing.

At least apart of heat generated in the second electronic component is transmitted to a part of the fins of the second housing. In at least one of cross sections of the first circuit board in a thickness direction, the electronic control device has a structure having a region in which the fin of the first housing is longer than the fins of the second housing and a region in which the fin of the first housing is shorter than the fin of the second housing. The electronic control device is cooled by natural air cooling, forced air cooling by the air cooling fans 6, water cooling, or the like.

REFERENCE SIGNS LIST

1 upper housing
2 lower housing
3 upper fin
4 lower fin
5 cover (housing)
6 air cooling fan
7 upper circuit board
8 lower circuit board
9, 13 heat generating component
10 thermal conductive material
11 boss portion
12 screw
100, 101, 102 electronic control device

The invention claimed is:
1. An electrical device, comprising:
a first housing which has therein a first circuit board on which at least a first electronic component is mounted;
a second housing which has therein a second circuit board on which at least a second electronic component is mounted; and
at least one or more fans which send air passing between the first housing and the second housing,
wherein the first housing has a plurality of fins facing the second housing,
the second housing has a plurality of fins facing the first housing, and
in at least one of cross sections of the first circuit board in a thickness direction, the electrical device has a structure having a region in which the fin of the first housing is longer than the fin of the second housing and a region in which the fin of the first housing is shorter than the fin of the second housing.
2. The electrical device according to claim 1, wherein
at least a part of heat generated in the first electronic component is transmitted to a part of the fins of the first housing,
a part of heat generated in the second electronic component is transmitted to a part of the fins of the second housing, and
the fins of the first housing and the fins of the second housing are cooled by air from the at least one or more fans.
3. The electrical device according to claim 2, wherein
the first electronic component and the second electronic component are integrated circuits, respectively,
in plan view from the thickness direction of the first circuit board, the first electronic component and the second electronic component are arranged at different positions,
in the fin of the first housing and the fin of the second housing arranged so as to overlap the first electronic component in the plan view from the thickness direction of the first circuit board, the fin of the first housing is longer than the fin of the second housing in a cross section of the first circuit board in the thickness direction, and
in the fin of the first housing and the fin of the second housing arranged so as to overlap the second electronic component in the plan view from the thickness direction of the first circuit board, the fin of the first housing is shorter than the fin of the second housing in the cross section of the first circuit board in the thickness direction.
4. The electrical device according to claim 3, wherein
a third electronic component which is an integrated circuit is mounted on the first circuit board,
the third electronic component and the second electronic component are arranged at positions partially overlapping each other in the plan view from the thickness direction of the first circuit board, and
in the plan view from the thickness direction of the first circuit board, the fin of the first housing disposed at a position where the third electronic component and the second electronic component overlap each other and the fin of the first housing disposed at a position where the third electronic component and the second electronic component do not overlap each other in a position where the third electronic component is disposed have different lengths in the cross section of the first circuit board in the thickness direction.
5. The electrical device according to claim 4, wherein, in the plan view from the thickness direction of the first circuit board, the fin of the first housing disposed at the position where the third electronic component and the second electronic component overlap each other has a shorter length in the cross section of the first circuit board in the thickness direction than the fin of the first housing disposed at the position where the third electronic component and the second electronic component do not overlap each other in the position where the third electronic component is disposed.

6. The electrical device according to claim 5, wherein
the second electronic component consumes power more than the third electronic component, and
in the plan view from the thickness direction of the first circuit board, for the fin of the first housing and the fin of the second housing arranged at the position where the third electronic component and the second electronic component overlap each other, the fin of the first housing has a shorter length in the cross section of the first circuit board in the thickness direction than the fin of the second housing.

7. The electrical device according to claim 6, wherein, in the plan view from the thickness direction of the first circuit board, the plurality of fins of the second housing arranged at positions overlapping with the second electronic component have a shorter length as the fins are farther from a center of the second electronic component in the cross section of the first circuit board in the thickness direction.

8. The electrical device according to claim 7, wherein, in the plan view from the thickness direction of the first circuit board, a plurality of fins of the first housing arranged at positions overlapping with the second electronic component have a longer length as the fins are farther from the center of the second electronic component in the cross section of the first circuit board in the thickness direction.

9. The electrical device according to claim 1, wherein
the first electronic component is an integrated circuit, and
in plan view from the thickness direction of the first circuit board, the first electronic component and a part of the fins of the first housing are arranged so as to overlap, and the first electronic component and the fins of the second housing are arranged so as not to overlap each other.

10. The electrical device according to claim 9, wherein
the second electronic component is an integrated circuit, and
in the plan view from the thickness direction of the first circuit board, the second electronic component and a part of the fins of the second housing are arranged so as to overlap, and the second electronic component and the fins of the first housing are arranged so as not to overlap each other.

11. The electrical device according to claim 10, wherein, in the plan view from the thickness direction of the first circuit board, the first electronic component is disposed at a position where the integrated circuit is not mounted on the second circuit board, and the second electronic component is disposed at a position where the integrated circuit is not mounted on the first circuit board.

12. The electrical device according to claim 1, wherein an interval between the plurality of fins of the first housing and an interval between the plurality of fins of the second housing are the same.

13. An electronic control device, comprising:
a first housing which has therein a first circuit board on which at least a first electronic component is mounted;
a second housing which has therein a second circuit board on which at least a second electronic component is mounted; and
a third housing which has therein the first housing and the second housing,
wherein the first housing has a plurality of fins facing the second housing,
the second housing has a plurality of fins facing the first housing,
at least a part of heat generated in the first electronic component is transmitted to at least of a part of the fins of the first housing,
at least a part of heat generated in the second electronic component is transmitted to a part of the fins of the second housing, and
in at least one of cross sections of the first circuit board in a thickness direction, the electronic control device has a structure having a region in which the fin of the first housing is longer than the fin of the second housing and a region in which the fin of the first housing is shorter than the fin of the second housing.

* * * * *